United States Patent
Chen et al.

(10) Patent No.: US 10,930,874 B2
(45) Date of Patent: Feb. 23, 2021

(54) ORGANIC LIGHT EMITTING DISPLAY DEVICE

(71) Applicants: Kuan-Yu Chen, Taoyuan (TW); Hsiao-Lung Lin, New Taipei (TW)

(72) Inventors: Kuan-Yu Chen, Taoyuan (TW); Hsiao-Lung Lin, New Taipei (TW)

( * ) Notice: Subject to any disclaimer, the term of this patent is extended or adjusted under 35 U.S.C. 154(b) by 0 days.

(21) Appl. No.: 16/794,255

(22) Filed: Feb. 19, 2020

(65) Prior Publication Data
US 2020/0266377 A1  Aug. 20, 2020

(30) Foreign Application Priority Data
Feb. 19, 2019 (TW) .................................. 108105471

(51) Int. Cl.
*H01L 51/50* (2006.01)
*H01L 51/52* (2006.01)

(52) U.S. Cl.
CPC ...... *H01L 51/5056* (2013.01); *H01L 51/5072* (2013.01); *H01L 51/5206* (2013.01); *H01L 51/5221* (2013.01)

(58) Field of Classification Search
CPC ............. H01L 51/5056; H01L 51/5072; H01L 51/5221; H01L 51/5206
See application file for complete search history.

(56) References Cited

U.S. PATENT DOCUMENTS

| | | | |
|---|---|---|---|
| 2006/0038176 A1* | 2/2006 | Akimoto | G02F 1/136286 257/59 |
| 2011/0300770 A1* | 12/2011 | Fukuda | H01J 37/32091 445/58 |
| 2013/0153873 A1* | 6/2013 | Watanabe | H01L 51/50 257/40 |
| 2016/0254322 A1* | 9/2016 | Zheng | H01L 27/3262 257/40 |
| 2017/0186989 A1* | 6/2017 | Hosono | H01L 51/5072 |

* cited by examiner

*Primary Examiner* — Jay C Chang
*Assistant Examiner* — Mikka Liu
(74) *Attorney, Agent, or Firm* — JCIPRNET

(57) ABSTRACT

An organic light emitting display device including a substrate, an anode, a hole transport layer, a cathode, an electron transport layer and an organic light emitting layer is provided. The anode is located on the substrate. The hole transport layer is located on the anode. The cathode is located on the substrate. The electron transport layer is located on the cathode. The organic light emitting layer is located between the hole transport layer and the electron transport layer. A vertical projection of the anode on the substrate is not overlapped with a vertical projection of the cathode on the substrate.

15 Claims, 3 Drawing Sheets

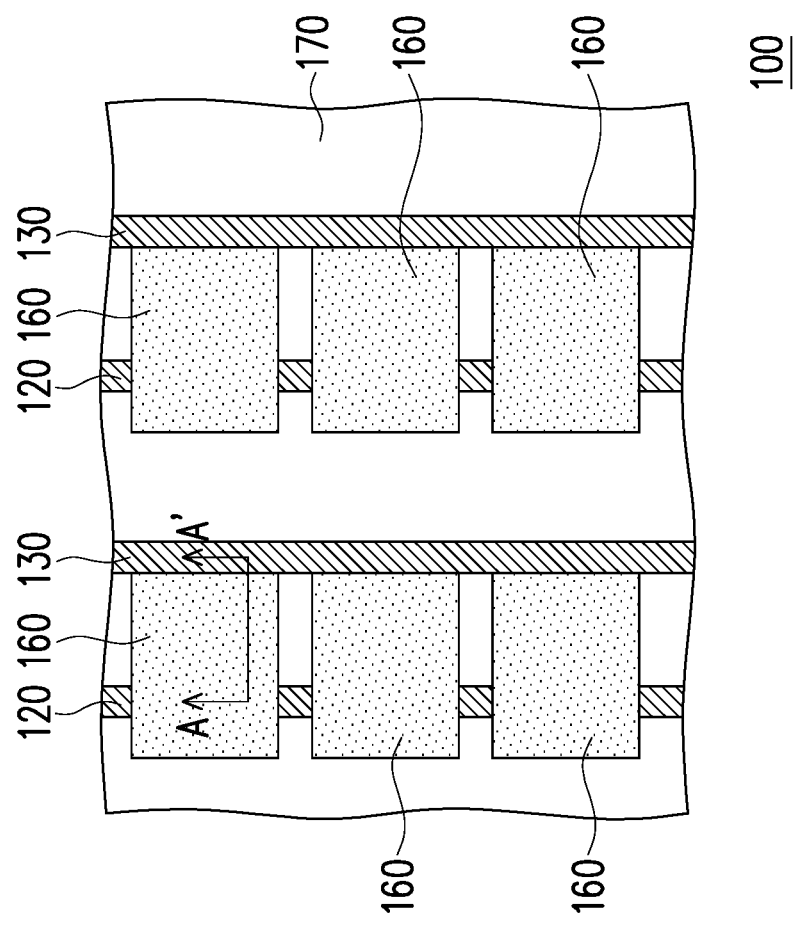
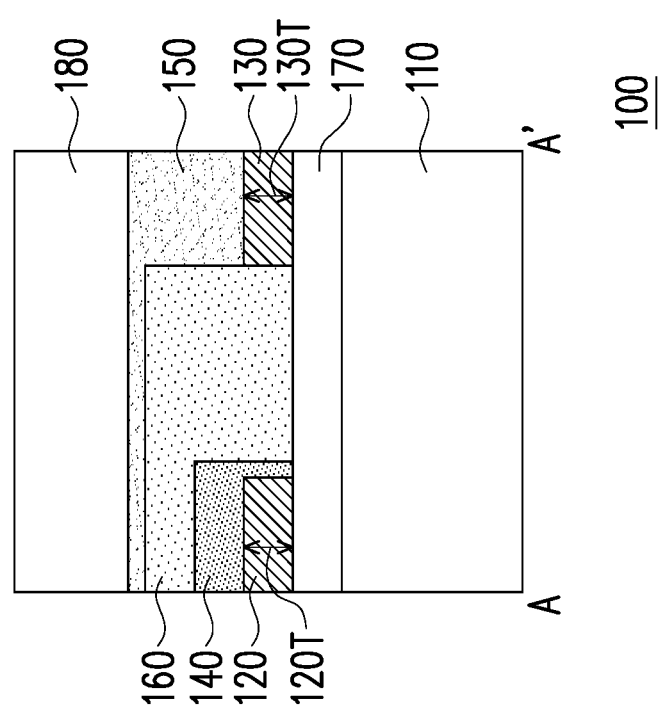
FIG. 1A
FIG. 1B

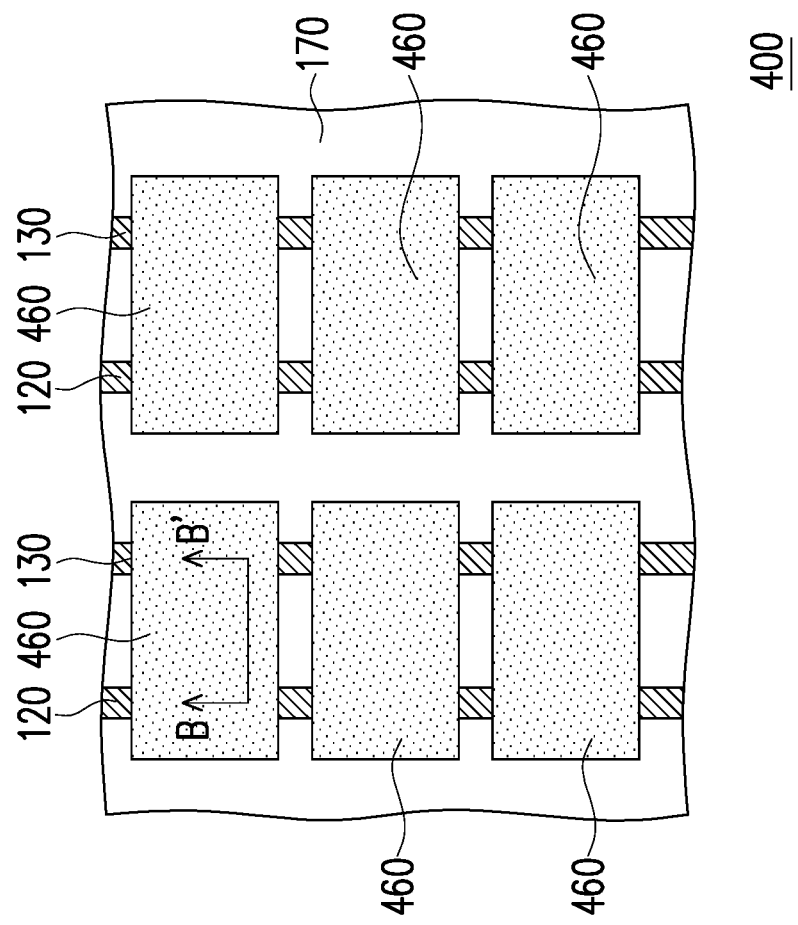
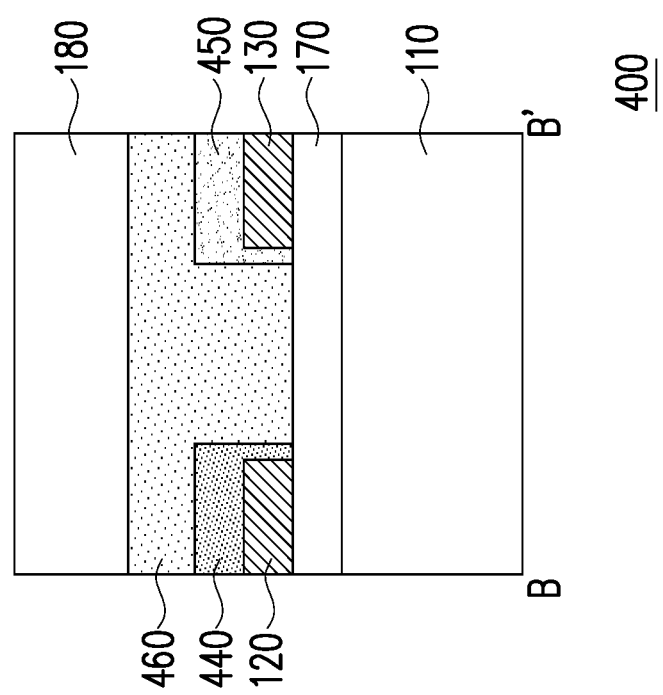
FIG. 4A
FIG. 4B

ORGANIC LIGHT EMITTING DISPLAY DEVICE

CROSS-REFERENCE TO RELATED APPLICATION

This application claims the priority benefit of Taiwan application serial no. 108105471, filed on Feb. 19, 2019. The entirety of the above-mentioned patent application is hereby incorporated by reference herein and made a part of this specification.

BACKGROUND

Technical Field

The invention relates to a light emitting display device, and particularly relates to an organic light emitting display device.

Description of Related Art

In general, display devices using inorganic semiconductor light emitting diodes have very poor overall light uniformity. Even if sub-millimeter light emitting diodes (mini LEDs) are adopted, problems of yield and cost for mass transfers are still encountered in manufacturing.

Organic light emitting display devices are light emitting elements using light emitting organic compounds, which have characteristics such as wide viewing-angles, high response speeds, ultra-thinness, etc., and therefore an application range of the organic light emitting display devices is more and more widespread.

SUMMARY

The invention is directed to an organic light emitting display device, which has a simple structure and lower cost.

The invention provides an organic light emitting display device including a substrate, an anode, a hole transport layer, a cathode, an electron transport layer and an organic light emitting layer. The anode is located on the substrate. The hole transport layer is located on the anode. The cathode is located on the substrate. The electron transport layer is located on the cathode. The organic light emitting layer is located between the hole transport layer and the electron transport layer. A vertical projection of the anode on the substrate is not overlapped with a vertical projection of the cathode on the substrate.

In an embodiment of the invention, materials and thicknesses of the anode and the cathode are substantially the same.

In an embodiment of the invention, there is no other organic light emitting layer on the substrate.

In an embodiment of the invention, the substrate is a metal plate, and the organic light emitting display device further includes an insulation layer. The insulation layer is located between the anode and the substrate and between the cathode and the substrate.

In an embodiment of the invention, the insulation layer comprehensively covers the substrate, and the insulation layer does not have a conductive via.

In an embodiment of the invention, the anode and the cathode are located at the same side of the organic light emitting layer.

In an embodiment of the invention, the organic light emitting layer does not have a conductive material on an opposite side relative to the anode and the cathode.

In an embodiment of the invention, the hole transport layer is further located between the anode and the cathode.

In an embodiment of the invention, the electron transport layer is further located between the anode and the cathode.

In an embodiment of the invention, at least one of the hole transport layer and the electron transport layer is not located between the anode and the cathode.

In an embodiment of the invention, the organic light emitting display device further includes a protection layer. The protection layer is located on the organic light emitting layer.

In an embodiment of the invention, the organic light emitting display device further includes a filter layer. The filter layer is located on the organic light emitting layer.

In an embodiment of the invention, the organic light emitting display device further includes a light conversion layer. The light conversion layer is located on the organic light emitting layer.

Based on the above description, the organic light emitting display device of the invention is relatively simple in structure or manufacturing method and has a lower cost.

To make the aforementioned more comprehensible, several embodiments accompanied with drawings are described in detail as follows.

BRIEF DESCRIPTION OF THE DRAWINGS

FIG. 1A is a partial schematic cross-sectional view of an organic light emitting display device according to a first embodiment of the invention.

FIG. 1B is a partial schematic top view of the organic light emitting display device according to the first embodiment of the invention.

FIG. 4A is a partial schematic cross-sectional view of an organic light emitting display device according to the fourth embodiment of the invention.

FIG. 4B is a partial schematic top view of the organic light emitting display device according to the fourth embodiment of the invention.

DESCRIPTION OF THE EMBODIMENTS

Figure 3:
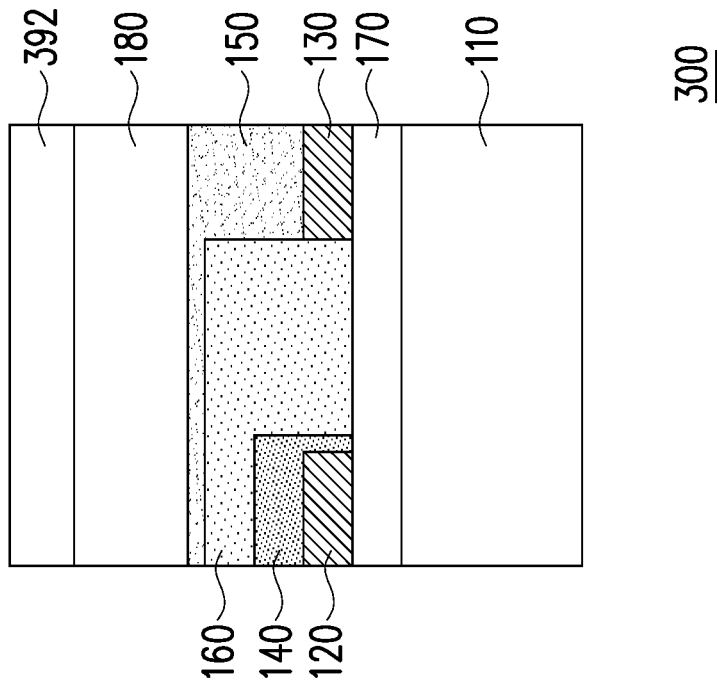
FIG. 3 is a partial schematic cross-sectional view of an organic light emitting display device according to the third embodiment of the invention.

The invention will be explained more fully below with reference to the drawings of the embodiments. However, the invention may also be embodied in various forms and should not be limited to the embodiments described herein. Thicknesses of layers or regions in the drawings are exaggerated for clarity's sake. The same or similar referential numbers indicate the same or similar elements, which are not repeated one-by-one in the following paragraphs. Moreover, directional terminology, such as "top," "bottom," "left," "right," "front," "back," etc., is used with reference to the orientation of the Figure(s) being described and are not intended to be limiting of the invention.

FIG. 1A is a partial schematic cross-sectional view of an organic light emitting display device according to a first embodiment of the invention. FIG. 1B is a partial schematic top view of the organic light emitting display device according to the first embodiment of the invention. To be specific, FIG. 1A may be a schematic cross-sectional view of FIG. 1B along a section line AA'. Moreover, for clarity, a part of film layers or components may be omitted from FIG. 1A and FIG. 1B. For example, in FIG. 1B, only an anode 120, a cathode 130, an organic light emitting layer 160 and an insulation layer 170 of an organic light emitting display device 100 are schematically illustrated.

Referring to FIG. 1A and FIG. 1B, in the embodiment, an example of a manufacturing method of the organic light emitting display device 100 may be as follows. However, it should be noted that the manufacturing method of the organic light emitting display device 100 is not limited by the invention.

First, a substrate 110 is provided. In the embodiment, the substrate 110 may be a metal plate, and the metal plate serving as the substrate 110 may be further provided with the insulation layer 170 thereon.

In the embodiment of FIG. 1A, the insulation layer 170 is shown in the form of a single film layer, but the invention is not limited thereto. In other embodiments, the insulation layer 170 may be formed by stacking a plurality of film layers.

In an embodiment, the insulation layer 170 may be made of an inorganic material such as $SiO_x$, $SiN_x$, SiON, $AlO_x$, AlON, other similar materials or a combination of the above materials. In an embodiment, the insulation layer 170 may be made of an organic material such as polyimide (PI), polycarbonate (PC), polyamide (PA), polyethylene terephthalate (PET), polyethylene naphthalate (PEN), polyethylenimine (PEI), polyurethane (PU), polydimethylsiloxane (PDMS), acrylate series such as polymethylmethacrylate (PMMA), etc., ether-based polymer such as polyethersulfone (PES) or polyetheretherketone (PEEK), etc., polyolefin, other similar materials or a combination of the above materials. In an embodiment, the aforementioned one or more organic materials and/or the aforementioned one or more inorganic materials may be stacked to form the insulation layer 170. The insulation layer 170 is first formed on the metal plate serving as the substrate 110, such that the anode 120 subsequently formed on the insulation layer 170 may be electrically insulated from the substrate 110, and the cathode 130 subsequently formed on the insulation layer 170 may be electrically insulated from the substrate 110.

In the embodiment, the insulation layer 170 comprehensively covers the substrate 110, and the insulation layer 170 does not have a conductive via (which is not illustrated due to its absence). In other words, any conductive element subsequently formed on the insulation layer 170 may be electrically insulated from the metal plate serving as the substrate 110.

Then, the anode 120 and the cathode 130 may be formed on the substrate 110. As shown in the embodiment of FIG. 1A, if the insulation layer 170 is formed on the substrate 110, the insulation layer 170 is located between the anode 120 and the substrate 110, and the insulation layer 170 is located between the cathode 130 and the substrate 110.

In the embodiment, a material of the anode 120 and a material of the cathode 130 are substantially the same, but the invention is not limited thereto. In the embodiment, a thickness 120T of the anode 120 and a thickness 130T of the cathode 130 are substantially the same, but the invention is not limited thereto. Moreover, based on consideration of electrical conductivity, the anode 120 and the cathode 130 are generally made of a metal material (such as copper), but the invention is not limited thereto. Compared with a transparent metal oxide conductive material, although the metal material is not transparent, it has better conductivity.

For example, a conductive layer may be formed on the substrate 110 (or on the insulation layer 170 on the substrate 110) by sputtering or evaporation, and then a part of the conductive layer is removed by etching to form the anode 120 and the cathode 130 on the substrate 110 (or on the insulation layer 170 on the substrate 110). In another embodiment, the anode 120 and the cathode 130 on the substrate 110 (or on the insulation layer 170 on the substrate 110) may be formed by screen printing. In other words, the anode 120 and the cathode 130 may be formed through the same step, and therefore the materials and thicknesses of the anode 120 and the cathode 130 may be substantially the same, and fabrication thereof is relatively simple. Moreover, a vertical projection of the anode 120 on the substrate 110 is not overlapped with a vertical projection of the cathode 130 on the substrate 110.

Then, a hole transport layer 140 is formed on the anode 120, an electron transport layer 150 is formed on the cathode 130, and an organic light emitting layer 160 is formed on the hole transport layer 140 and/or the electron transport layer 150. However, it should be noted that a forming sequence of the hole transport layer 140 and the electron transport layer 150 is not limited by the invention.

For example, in the embodiment, the hole transport layer 140 may be formed on the anode 120 first. Then, the organic light emitting layer 160 is formed on the hole transport layer 140, and then the electron transport layer 150 is formed on the organic light emitting layer 160 and the cathode 130.

The hole transport layer 140 is located on the anode 120. A material or a forming method of the hole transport layer 140 may be adaptively adjusted according to an actual requirement, which is not limited by the invention, and detail thereof is not repeated. For example, the material of the hole transport layer 140 is NPB (N,N'-bis(1-naphthyl)-N,N'-diphenyl-1,1'-biphenyl-4,4'-diamine), but the invention is not limited thereto. For another example, the hole transport layer 140 may be formed by, for example, evaporation, spraying, applying, printing, or other possible methods.

In the embodiment, the hole transport layer 140 is further located between the anode 120 and the cathode 130, but the invention is not limited thereto.

The organic light emitting layer 160 is located on the hole transport layer 140, and the organic light emitting layer 160 is located between the anode 120 and the cathode 130. A material or a forming method of the organic light emitting layer 160 may be adaptively adjusted according to an actual requirement, which is not limited by the invention, and detail thereof is not repeated. For example, the organic light emitting layer 160 may be formed by, for example, evaporation, spraying, applying, printing, or other possible methods.

In the embodiment, the electron transport layer 150 is located on the organic light emitting layer 160. Namely, the organic light emitting layer 160 is located between the hole transport layer 140 and the electron transport layer 150. A material or a forming method of the electron transport layer 150 may be adaptively adjusted according to an actual requirement, which is not limited by the invention, and detail thereof is not repeated. For example, the material of the electron transport layer 150 is $Alq_3$ (tris(8-hydroxyquinoline)aluminum), but the invention is not limited thereto. In another example, the electron transport layer 150 may be formed by, for example, evaporation, spraying, applying, printing, or other possible methods.

After the above manufacturing processes, manufacturing of the organic light emitting display device 100 of the embodiment is substantially completed. The organic light emitting display device 100 includes the substrate 110, the anode 120, the hole transport layer 140, the cathode 130, the electron transport layer 150, and the organic light emitting layer 160. The anode 120 is located on the substrate 110. The hole transport layer 140 is located on the anode 120. The cathode 130 is located on the substrate 110. The electron transport layer 150 is located on the cathode 130. The organic light emitting layer 160 is located between the hole transport layer 140 and the electron transport layer 150. A vertical projection of the anode 120 on the substrate 110 is not overlapped with a vertical projection of the cathode 130 on the substrate 110.

In the embodiment, there is no other organic light emitting layer (which is not illustrated due to its absence) other than the organic light emitting layer 160 on the substrate 110. In this way, patterning of the anode 120, the cathode 130, the hole transport layer 140, the electron transport layer 150, and the organic light emitting layer 160 may be relatively simple, and a yield of the organic light emitting display device 100 may be better, and the cost thereof may be relatively low.

In the embodiment, the substrate 110 may be a metal plate. The metal plate has better abrasion resistance, bendability or a heat dissipation property. Therefore, stability or the heat dissipation property of the organic light emitting display device 100 may be better.

In the embodiment, the metal plate serving as the substrate 110 is a bare substrate. In other words, the metal plate serving as the substrate 110 does not have any electronic element (for example, an active element, a passive element and wires) therein. Namely, the organic light emitting display device 100 may be a passive light emitting display device.

In the embodiment, the organic light emitting layer 160 does not have a conductive material (which is not illustrated due to its absence) on an opposite side relative to the anode 120 and the cathode 130. For example, as shown in the embodiment of FIG. 1A, the anode 120 and the cathode 130 are located at the side below the organic light emitting layer 160, and there is no conductive material above the organic light emitting layer 160. In this way, the cost of the organic light emitting display device 100 may be relatively low.

In the embodiment, the electron transport layer 150 is not located between the anode 120 and the cathode 130, but the invention is not limited thereto.

In the embodiment, the anode 120 and the cathode 130 are located at a same side of the organic light emitting layer 160. In this way, the organic light emitting display device 100 may emit light uniformly over an entire surface, and the organic light emitting display device 100 has better light uniformity.

In the embodiment, the hole transport layer 140 is further located between the anode 120 and the cathode 130, and the electron transport layer 150 may be not located between the anode 120 and the cathode 130.

In an embodiment that is not shown, the electron transport layer may be first formed on the cathode (for example, similar to the step or structure of forming the hole transport layer 140 on the anode 120 in the embodiment of FIG. 1A), and then the organic light emitting layer is formed on the electron transport layer (for example, similar to the step or structure of forming the organic light emitting layer 160 on the electron transport layer 140 in the embodiment of FIG. 1A), and then the electron transport layer is formed on the organic light emitting layer and the anode (for example, similar to the step or structure of forming the electron transport layer 140 on the organic light emitting layer 160 and the cathode 130 in the embodiment of FIG. 1A). In other words, in the aforementioned embodiment that is not shown, the electron transport layer is further located between the anode and the cathode, and the hole transport layer may be not located between the anode and the cathode.

In the embodiment, the organic light emitting display device 100 further includes a protection layer 180. The protection layer 180 is located on the organic light emitting layer 160. In the embodiment of FIG. 1A, the protection layer 180 is illustrated in the form of a single film layer, but the invention is not limited thereto. In other embodiments, the protection layer 180 may be formed by stacking a plurality of film layers.

For example, the protection layer 180 may include an optical-grade insulation film, an inorganic or organic insulation film, an optical film, a hard coat film, a water vapor blocking film with a low water vapor transmission rate (WVTR), an oxygen barrier film with a low oxygen transmission rate (OTR) or a superposition or combination of one or more of the above film layers.

Figure 2:
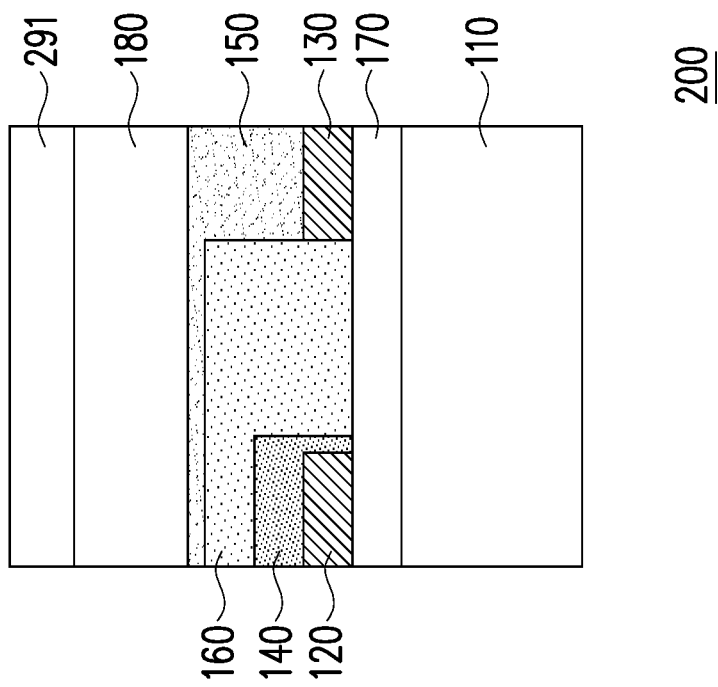
FIG. 2 is a partial schematic cross-sectional view of an organic light emitting display device according to the second embodiment of the invention.

FIG. 2 is a partial schematic cross-sectional view of an organic light emitting display device according to a second embodiment of the invention. In the embodiment, a manufacturing method of an organic light emitting display device 200 is similar to the manufacturing method of the organic light emitting display device 100 of the aforementioned embodiment, where the similar components are denoted by the same referential numbers, and have similar functions, materials or forming methods, so that descriptions thereof are omitted.

In the embodiment, the organic light emitting display device 200 further includes a filter layer 291. The filter layer 291 is located on the organic light emitting layer 160. In the embodiment of FIG. 2, the filter layer 291 is located on the protection layer 180.

In the embodiment of FIG. 2, only one filter layer 291 is illustrated, but the invention is not limited thereto. In an embodiment, an amount of the filter layers 291 may be plural, and the plurality of filter layers 291 may be overlapped or not overlapped, and colors of the plurality of filter layers 291 may be the same or different.

In an embodiment, if a light emitting color of the organic light emitting layer 160 has a large range, the organic light emitting display device 200 may have different light emitting colors in different regions by using a plurality of filter layers 291 with different colors.

FIG. 3 is partial schematic cross-sectional view of an organic light emitting display device according to a third embodiment of the invention. In the embodiment, a manufacturing method of an organic light emitting display device 300 is similar to the manufacturing method of the organic light emitting display device 100 of the aforementioned embodiment, where the similar components are denoted by the same referential numbers, and have similar functions, materials or forming methods, so that descriptions thereof are omitted.

In the embodiment, the organic light emitting display device 300 further includes a light conversion layer 392. The light conversion layer 392 is located on the organic light emitting layer 160. In the embodiment of FIG. 3, the light conversion layer 392 is located on the protection layer 180.

A material of the light conversion layer 392 includes one or more of quantum dots (QD), an upconversion material or a downconversion material. The light conversion layer 392 may absorb light emitted from the organic light emitting layer 160 and emit light of other colors different from the light emitting color of the organic light emitting layer 160.

In the embodiment of FIG. 3, only one light conversion layer 392 is illustrated, but the invention is not limited thereto. In an embodiment, an amount of the light conversion layers 392 may be plural, and the plurality of light conversion layers 392 may be overlapped or not overlapped, and materials or compositions of the plurality of light conversion layers 392 may be the same or different.

In an embodiment, the organic light emitting display device 300 may have different light emitting colors in different regions by using a plurality of light conversion layers 392 with different materials or compositions.

FIG. 4A is partial schematic cross-sectional view of an organic light emitting display device according to a fourth embodiment of the invention. FIG. 4B is a partial schematic top view of the organic light emitting display device according to the fourth embodiment of the invention. To be specific, FIG. 4A may be a schematic cross-sectional view of FIG. 4B along a section line BB'. Moreover, for clarity, a part of film layers or components are probably omitted from FIG. 4A and FIG. 4B. For example, in FIG. 4B, only the anode 120, the cathode 130, an organic light emitting layer 460 and the insulation layer 170 of the organic light emitting display device 400 are schematically illustrated.

In the embodiment, a manufacturing method of the organic light emitting display device 400 is similar to the manufacturing method of the organic light emitting display device 100 of the aforementioned embodiment, where the similar components are denoted by the same referential numbers, and have similar functions, materials or forming methods, so that descriptions thereof are omitted.

A hole transport layer 440, an electron transport layer 450 and the organic light emitting layer 460 of the organic light emitting display device 400 are respectively similar to the hole transport layer 140, the electron transport layer 150 and the organic light emitting layer 160 of the aforementioned embodiment, and a difference there between is that in the embodiment, the hole transport layer 440 may be formed on the anode 120, the electron transport layer 450 may be formed on the cathode 130, and the organic light emitting layer 460 is formed on the hole transport layer 440 and the electron transport layer 450 after the hole transport layer 440 and the electron transport layer 450 are formed (a forming sequence of the hole transport layer 440 and the electron transport layer 450 is not limited). In this way, the hole transport layer 440 may be further located between the anode 120 and the cathode 130, and the electron transport layer 450 may be further located between the anode 120 and the cathode 130.

In an embodiment that is not illustrated, an organic light emitting display device (for example, an organic light emitting display device similar to the organic light emitting display device 400) may include a filter layer (for example, the filter layer 291).

In an embodiment that is not illustrated, an organic light emitting display device (for example, an organic light emitting display device similar to the organic light emitting display device 400) may include a light conversion layer (for example, the light conversion layer 391).

In an embodiment that is not illustrated, an organic light emitting display device (for example, an organic light emitting display device similar to the organic light emitting display device 100 or the organic light emitting display device 400) may include a filter layer (for example, the filter layer 291) and a light conversion layer (for example, the light conversion layer 391).

In summary, the organic light emitting display device of the invention may be relatively simple in structure or manufacturing method and the cost is relatively low.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:
1. An organic light emitting display device, comprising:
   a substrate;
   an anode, located on the substrate;
   a hole transport layer, located on the anode;
   a cathode, located on the substrate, and a vertical projection of the anode on the substrate being not overlapped with a vertical projection of the cathode on the substrate;
   an electron transport layer, located on the cathode; and
   an organic light emitting layer, located between the hole transport layer and the electron transport layer, wherein the substrate is a metal plate, the anode is electrically insulated from the substrate, and the cathode is electrically insulated from the substrate.

2. The organic light emitting display device as claimed in claim 1, wherein materials and thicknesses of the anode and the cathode are substantially the same.

3. The organic light emitting display device as claimed in claim 1, wherein there is no other organic light emitting layer other than the organic light emitting layer on the substrate.

4. The organic light emitting display device as claimed in claim 1, further comprises:
   an insulation layer, located between the anode and the substrate and between the cathode and the substrate.

5. The organic light emitting display device as claimed in claim 4, wherein the insulation layer comprehensively covers the substrate, and the insulation layer does not have a conductive via.

6. The organic light emitting display device as claimed in claim 1, wherein the anode and the cathode are located at a same side of the organic light emitting layer.

7. The organic light emitting display device as claimed in claim 6, wherein the organic light emitting layer does not have a conductive material on an opposite side relative to the anode and the cathode.

8. The organic light emitting display device as claimed in claim 1, wherein
   the hole transport layer is further located between the anode and the cathode; or
   the electron transport layer is further located between the anode and the cathode.

9. The organic light emitting display device as claimed in claim 8, wherein
   the hole transport layer is further located between the anode and the cathode; and
   the electron transport layer is further located between the anode and the cathode.

10. The organic light emitting display device as claimed in claim 1, wherein at least one of the hole transport layer and the electron transport layer is not located between the anode and the cathode.

11. The organic light emitting display device as claimed in claim 1, further comprising:
   a protection layer, located on the organic light emitting layer.

12. The organic light emitting display device as claimed in claim 1, further comprising:
   a filter layer, located on the organic light emitting layer.

13. The organic light emitting display device as claimed in claim 1, further comprising:
   a light conversion layer, located on the organic light emitting layer.

14. The organic light emitting display device as claimed in claim 1 is a passive light emitting display device.

15. A passive light emitting display device, comprising:
   a substrate;
   an anode, located on the substrate;
   a hole transport layer, located on the anode;
   a cathode, located on the substrate, and a vertical projection of the anode on the substrate being not overlapped with a vertical projection of the cathode on the substrate;
   an electron transport layer, located on the cathode; and
   an organic light emitting layer, located between the hole transport layer and the electron transport layer.

* * * * *